United States Patent [19]
Kan et al.

[11] Patent Number: 6,002,701
[45] Date of Patent: *Dec. 14, 1999

[54] SELF-PULSATION TYPE SEMICONDUCTOR LASER DEVICE

[75] Inventors: Yasuo Kan; Kentaro Tani; Tadashi Takeoka; Akiyoshi Sugahara, all of Nara, Japan

[73] Assignee: Sharp Kabushiki Kaisha, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/771,150

[22] Filed: Dec. 20, 1996

[30] Foreign Application Priority Data

Dec. 26, 1995 [JP] Japan ..................... 7-339697

[51] Int. Cl.$^6$ ....................................... H01S 3/19
[52] U.S. Cl. ................................. 372/46; 372/45
[58] Field of Search ........................ 372/46, 45

[56] References Cited

U.S. PATENT DOCUMENTS 5,253,264  10/1993  Suzuki et al. ................. 372/46
5,416,790   5/1995  Yodoshi et al. .

FOREIGN PATENT DOCUMENTS

0413567 A2   2/1991  European Pat. Off. .
5-160503     6/1993  Japan .
6-260716     9/1994  Japan .
7-193316     7/1995  Japan .

OTHER PUBLICATIONS

Adacjo et a; "Self–Sustained Pulsation in 650–NM–Band Algainp Visible–Laser Diodes with Highly Doped Saturable Absorbing Layer", IEEE Photonics Technology Letters, vol. 7, No. 12, Dec. 1, 1995, pp. 1406–1408, XP000547466.

Hoskens et al, "Self–Pulsating Lasers with Quantum Well Saturable Absorber", Applied Physics Letters, vol. 67, No. 10, Sep. 4, 1995, New York, US, pp. 1343–1345, XP002029260.

Primary Examiner—Rodney Bovernick
Assistant Examiner—Yisun Song
Attorney, Agent, or Firm—Nixon & Vanderhye, P.C.

[57] ABSTRACT

A self-pulsation type semiconductor laser device includes a semiconductor substrate of a first conductive type and a multilayered structure including at least an active layer provided on the semi conductor substrate. The multilayered structure includes a first cladding layer of the first conductive type provided below the active layer, a second cladding layer of a second conductive type having a striped ridge portion provided above the active layer and a saturable absorbing film provided over the second cladding layer. The saturable absorbing film includes an accumulation region for accumulating photoexcited carriers. The accumulating region is provided apart from a surface of the second cladding layer.

9 Claims, 8 Drawing Sheets

MBE growth

FIG. 2B

Formation of striped ridge

FIG. 2C

Buried layer regrowth

FIG. 3A  [Buried layer of the present invention]
(Carriers are easily trapped)

FIG. 3B  [Buried layer of prior art]
(Carriers are not easily trapped)

| | Prior art | Present invention |
|---|---|---|
| Providing a thicker saturable absorbing region | Saturable absorbing region / Active layer / Thick active layer → Large vertical radiation angle | Saturable absorbing region / Active layer / Thin active layer → Small vertical radiation angle |
| Raising a doping concentration in a p-type cladding layer | Current / Not saturable absorbing region / Active layer / Self pulsation does not occur → Difficult in operating at a high temperature | Saturable absorbing region / Current / Active layer / Self pulsation occurs → Operable at a high temperature |

SELF-PULSATION TYPE SEMICONDUCTOR LASER DEVICE

BACKGROUND OF THE INVENTION

1. Field of the Invention

The present invention relates to a self-pulsation type semiconductor laser device. More specifically, the present invention relates to a self-pulsation type semiconductor laser device having a low level of noise, which is suitable as a light source for recording and reproducing operations of an optical disk or the like.

2. Description of the Related Art

When laser beams reflected from an optical disk or the like enter a semiconductor laser device which oscillates in a single longitudinal mode, an oscillation state is unstable and changes due to optical interference, resulting in the generation of noise. Such noise, referred to as "noise due to return light", significantly disrupts the performance of the semiconductor laser device in the case where it is used as a light source for the reproducing operation of an optical disk or the like.

In order to reduce the noise due to the return light, conventionally, a current oscillating at a high frequency (hereinafter, referred to as the "high frequency oscillating current") is overlapped with a driving current of the semiconductor laser device (referred to as the "high frequency overlapping method").

More specifically, when the high frequency oscillating current is overlapped with the driving current, a laser beam pulse train is generated in synchronization with the phase of the high frequency oscillating current. At this time, the laser oscillation mode is changed in an extremely short time (e.g., about 2 nanoseconds), and the wavelength of the laser beam pulse train is correspondingly changed in a discontinuous manner within a small range (e.g., within the range of ±2 nm from the central wavelength). As a result, at the time when the laser beams return to the semiconductor laser device after being reflected from an optical disk or the like (i.e., when the return light reaches the semiconductor laser device), coherence between the return light and the laser beams in an oscillation state disappears (i.e., the return light and the laser beams become incoherent), resulting in an unstable variation in the laser oscillation being suppressed. As a result, the generation of noise due to the return light can be prevented.

This method, however, requires a circuit dedicated for generating the high frequency oscillating current; therefore, this method is not suitable for realizing the miniaturization of a device to which the semiconductor laser device is to be incorporated (e.g., a reproduction apparatus for an optical disk).

In recent years, a semiconductor laser device not requiring a circuit for generating the high frequency oscillating current has been developed by utilizing the self-pulsation phenomenon of the semiconductor laser device. Such a semiconductor laser device is referred to as a self-pulsation type semiconductor laser device, and includes a saturable absorbing region in an optical waveguide portion of the semiconductor laser device. In the self-pulsation type semiconductor laser device, a laser oscillation mode periodically changes in an extremely short time by the function of the saturable absorbing region without overlapping the high frequency oscillating current with a dc driving current, thus achieving a low level of noise by a mechanism similar to the above-mentioned high frequency overlapping method.

Hereinafter, a conventional example of a self pulsation type semiconductor laser device will be described with reference to the accompanying drawings.

Figure 8:
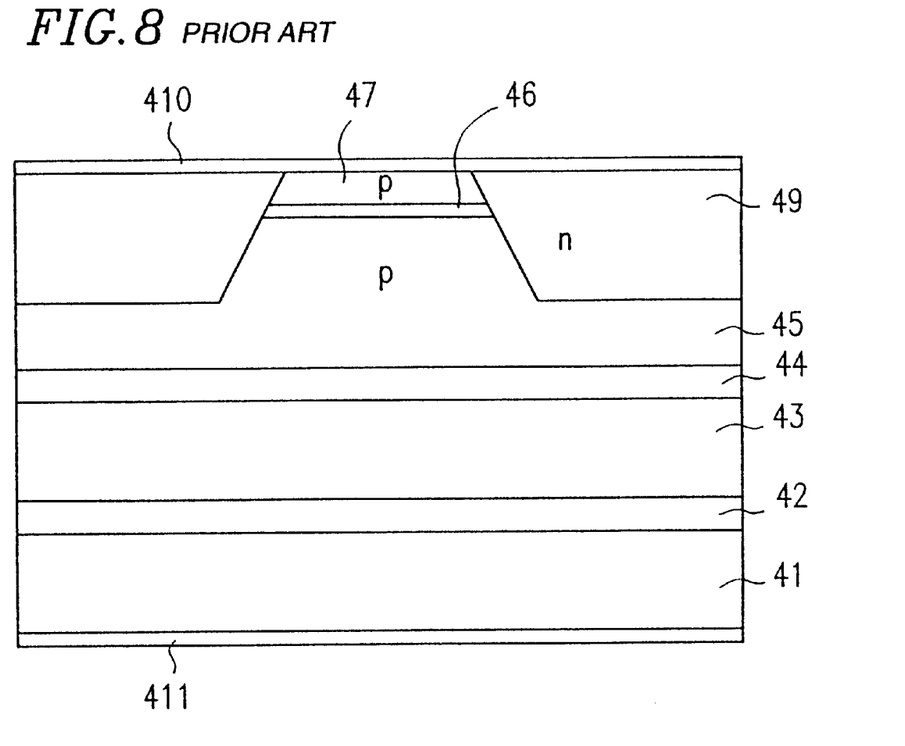
FIG. 8 is a cross-sectional view showing a conventional structure of a self-pulsation type semiconductor laser device.

A semiconductor laser device shown in FIG. 8 includes an n-type GaAs substrate 41 and a semiconductor multilayered structure which is grown thereon.

This semiconductor multilayered structure includes an n-type buffer layer 42, an n-type first cladding layer 43, an active layer 44, and a p-type second cladding layer 45, on the substrate 41 in this order. The second cladding layer 45 includes a striped ridge portion, and the portions on both sides of the ridge portion (non-ridge portions) of the second cladding layer 45 are thinner than the ridge portion. A p-type contact layer 47 is formed on the ridge portion of the second cladding layer 45 via a p-type intermediate layer 46. An n-type GaAs buried layer 49 is formed on the both sides of the striped ridge. Lateral confinement of light in a horizontal direction is achieved by a difference in equivalent refractive indexes between the ridge portion and the non-ridge portion.

A p-type electrode 410 is provided on the upper face of the semiconductor multilayered structure, and an n-type electrode 411 is provided on the lower face of the substrate 41. A voltage is applied between the electrodes 410 and 411 so as to allow carriers necessary for generating laser beams to be injected into the active layer 44.

When a voltage is applied between the electrodes 410 and 411, reverse bias is applied to the pn junction between the p-type semiconductor layer and the n-type GaAs buried layer 49 in the semiconductor multilayered structure. For this reason, current does not flow through the GaAs buried layer 49 and is narrowed to the striped ridge portion. As a result, current flows through a selected region in the active layer 44 (i.e., a region located immediately below the striped ridge portion).

The region in the active layer 44 through which current flows to a level exceeding a predetermined level functions as "a gain region" for laser beams, and the other regions function as "a saturable absorbing region". The function of the saturable absorbing region will be described below.

The saturable absorbing region functions not as a gain region for laser beams, but as an absorbing region. At this time, an extent to which the saturable absorbing region absorbs laser beams (light absorption amount) depends on the density of photoexcited carriers which are present in the saturable absorbing region. Herein, the term "photoexcited carriers" refers to electrons and holes which are excited from a valence band to a conduction band by absorbing laser beams.

Figure 9:
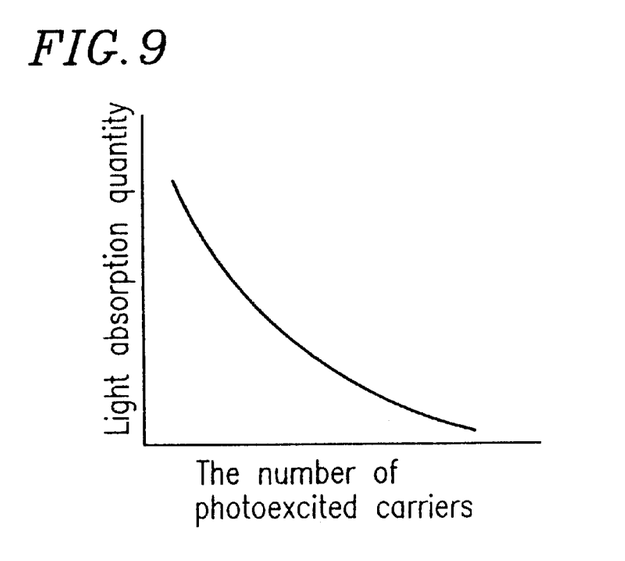
FIG. 9 is a graph showing the relationship between the number of excited carriers and a light absorption amount in a saturable absorbing film.

FIG. 9 shows the relationship between the light absorption quantity and the number (density) of photoexcited carriers. The light absorption quantity lowers as the photoexcited carrier density increases, and the light absorption quantity increases as the photoexcited carrier density lowers. When the light absorption quantity of the saturable absorbing region periodically changes, an internal loss of the semiconductor laser device also periodically changes. Thus, a threshold current density necessary for laser oscillation periodically changes. As a result, even if the driving current is kept constant, substantially the same effect as obtained in the case where the driving current varies can be provided, resulting in the achievement of self-pulsation.

However, the above-mentioned prior art poses the following problems.

In the structure shown in FIG. 8, laser beams are distributed not only in the gain region in the active layer 44, but also in the saturable absorbing region outside the gain region. For the purpose of causing self-pulsation, an overlapped area of the laser beam and the saturable absorbing region is required to be as wide as possible. In order to obtain a wide overlapped portion, it is necessary to enlarge the saturable absorbing region by making the active layer 44 thick, or to expand a region in which the laser beam is distributed in a lateral direction (hereinafter, referred to as the "laser beam distributed region") by making the non-ridge portion of the second cladding layer 45 thick. However, if the overlapped portion of the laser beam distributed region and the saturable absorbing region becomes wide, the following two problems arise.

First, when the active layer 44 is thicker, a light confinement effect in a vertical direction becomes strong. As a result, a radiation angle $\theta\perp$ of laser beams in a vertical direction becomes undesirably wide.

Generally, a radiation angle $\theta\|$ of laser beams in a horizontal direction is typically about 8° to about 10°, and this is determined by the width of the striped ridge. On the other hand, the radiation angle $\theta\perp$ of laser beams in a vertical direction depends on the thickness of the active layer 44, and can be about 40° in the case where the active layer 44 has a thickness necessary for achieving self-pulsation.

As the radiation angle $\theta\perp$ of laser beams in a vertical direction becomes large, the ellipticity of radiated laser beams becomes large. Excessively large ellipticity causes the deterioration in the efficiency of a lens conversion, thus presenting a disadvantage for use as a light source for an optical disk. On the other hand, when the active layer 44 is made thinner for the purpose of reducing the ellipticity, self-pulsation does not occur.

For example, according to the results of an experiment by the present inventors, an active layer having a multiple quantum well (MQW) structure including a well layer having a thickness of about 6 nm requires 8 or more well layers for causing self-pulsation. Self-pulsation does not occur with 7 or less well layers. On the other hand, in order to obtain a preferable ellipticity as light source for an optical disk, it is preferable that the number of well layers is 7 or less.

Secondly, there is a problem regarding a doping level of the second cladding layer 45.

Generally, it is known that the overflow of carriers from the active layer 44 can be suppressed by increasing the doping level of impurities in the second cladding layer 45. The overflow of carriers occurs more easily as the operating temperature of the semiconductor laser device becomes higher. This is because the kinetic energy of the carriers increases at a high temperature. When the carriers overflow from the active layer 44, invalid currents increase, resulting in an increase of operating current. When the doping level of impurities in the second cladding layer 45 increases, the barrier height of the second cladding layer 45 to the active layer 44 can increase. Thus, the increase of the doping level of the impurities in the second cladding layer 45 is effective for preventing the overflow of the carriers.

However, in the semiconductor laser device having the structure shown in FIG. 8, when the doping level of the second cladding layer 45 increases, an electrical resistivity of the second cladding layer 45 lowers. Thus, the current injected from the electrode flows through the non-ridge portion of the second cladding layer 45 in a spreading manner in a lateral direction. For example, when the second cladding layer 45 is doped with p-type impurities of about $1\times10^{18}$ cm$^{-3}$ or more, self-pulsation cannot be achieved.

This is because current flows into the saturable absorbing region by the spread of the current in the lateral direction, and a gain is generated therein, resulting in the disappearance of the light absorbing function. As a result, the saturable absorbing region no longer functions as such. More specifically, the region which can function as the saturable absorbing region moves to the direction further apart from the laser beam distributed region, and interaction between the laser beams and the saturable absorbing region lowers significantly.

Accordingly, for the semiconductor laser device having the conventional structure as shown in FIG. 8, the doping level of impurities in the second cladding layer 45 cannot be increased. For this reason, it is difficult to perform an operation at a high temperature due to the overflow of carriers.

SUMMARY OF THE INVENTION

A self-pulsation type semiconductor laser device of this invention includes a semiconductor substrate of a first conductive type and a multilayered structure including at least an active layer provided on the semiconductor substrate. The multilayered structure includes a first cladding layer of the first conductive type provided below the active layer, a second cladding layer of a second conductive type having a striped ridge portion provided above the active layer and a saturable absorbing film provided over the second cladding layer. The saturable absorbing film includes an accumulation region for accumulating photoexcited carriers. The accumulating region is provided apart from a surface of the second cladding layer.

In one embodiment of the invention, the saturable absorbing film includes a first barrier semiconductor layer having a first bandgap, a well semiconductor layer having a second bandgap smaller than the first bandgap and a second barrier semiconductor layer having a third bandgap larger than the second bandgap. Preferably, a thickness of the first barrier semiconductor layer is set so that the photoexcited carriers in the accumulation region are not prevented from recombining via a non-emission recombination center present at an interface between the saturable absorbing film and the second cladding layer. The thickness of the first barrier semiconductor layer may be about 10 nm or more.

In one embodiment of the invention, the first barrier semiconductor layer is formed of a first AlGaAs layer. The well semiconductor layer is formed of a GaAs layer and functions as the accumulation region. The second barrier semiconductor layer is formed of a second AlGaAs layer.

In another embodiment of the invention, the saturable absorbing film has a multiple quantum well structure, and a plurality of well layers in the multiple quantum well structure function as the accumulation regions.

In still another embodiment of the invention, the self-pulsation type semiconductor laser device further includes a semiconductor buried layer for absorbing laser beams provided on the saturable absorbing film. The semiconductor buried layer may be formed of a GaAs layer.

In still another embodiment of the invention, the second cladding layer is doped with a impurities of a second conductive type at a concentration of about $1\times10^{18}$ $^{cm-3}$ or more.

Thus, the invention described herein makes possible the advantage of providing a self-pulsation type semiconductor laser device having a low noise level, which is capable of stably operating at a high temperature with a small radiation angle $\theta\perp$ in a vertical direction.

This and other advantages of the present invention will become apparent to those skilled in the art upon reading and understanding the following detailed description with reference to the accompanying figures.

DESCRIPTION OF THE PREFERRED EMBODIMENTS

A semiconductor laser device of the present invention includes a saturable absorbing film (i.e., saturable absorbing region) provided outside a striped ridge structure, as a layer different from an active layer. The saturable absorbing film internally includes a region where photoexcited carriers are accumulated (hereinafter, referred to as the "accumulation region"), and the accumulation region is provided apart from the surface (i.e., regrowth interface) of an upper cladding layer (i.e., second cladding layer). Such an accumulation region allows the excited carriers generated in the saturable absorbing film to be accumulated in the saturable absorbing film without letting them flow into the inside of a buried layer, thus causing self-pulsation. In particular, since the excited carriers are accumulated in a location apart from the regrowth interface, they are not trapped in a non-emission recombination center. Thus, the saturable absorbing region delivers its high performance as such.

The present invention will be described by way of examples with reference to the accompanying drawings below.

EXAMPLE 1

First, an example where the present invention is applied to an AlGaInP type semiconductor laser device will be described.

Figure 1A:
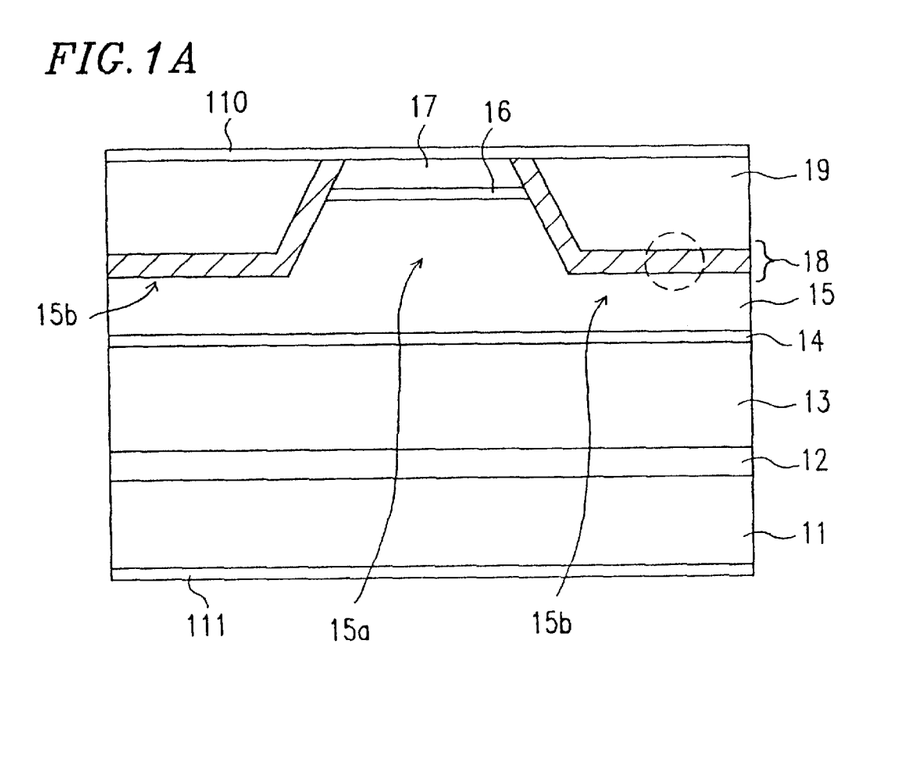
FIG. 1A is a cross-sectional view showing a structure of a self-pulsation type semiconductor laser device according to the present invention.

The semiconductor laser device of FIG. 1A includes an n-type (first conductive type) GaAs substrate 11 and a semiconductor multilayered structure including a plurality of semiconductor layers which are epitaxially grown on the substrate 11.

The semiconductor multilayered structure includes an n-type GaAs buffer layer 12 (n-type impurities: Si, impurity concentration: about $1 \times 10^{18}$ cm$^{-3}$, thickness: about 200 nm), an n-type $(Al_{0.7}Ga_{0.3})_{0.5}In_{0.5}P$ first cladding layer 13 (n-type impurities: Si, impurity concentration: about $1 \times 10^{18}$ cm$^{-3}$, thickness: about 1200 nm), a GaInP active layer 14 (thickness: about 400 nm) and a p-type (second conductive type) $(Al_{0.7}Ga_{0.3})_{0.5}In_{0.5}P$ second cladding layer 15 (p-type impurities: Be, impurity concentration: about $1.5 \times 10^{18}$ cm$^{-3}$, thickness: about 1200 nm) formed on the substrate 11 in this order.

The second cladding layer 15 includes a striped ridge portion 15a having a width of about 3.5 μm to about 4.5 μm, and the portions on both sides of the ridge portion 15a are thinner than the ridge portion 15a. The width of the ridge portion 15a defines a distribution width of a gain region along a lateral direction and further a beam width of laser beams. Hereinafter, the portion in the second cladding layer 15 which is thinner as described above is referred to as a non-ridge portion 15b.

The thickness of the second cladding layer 15 for the ridge portion 15a is typically about 0.8 μm to about 1.2 μm, and the thickness of the second cladding layer 15 for the non-ridge portion 15b is typically about 0.10 μm to about 0.25 μm. In view of distributing light to a saturable absorbing film, the thickness of the non-ridge portion 15b is preferably in the range of about 0.10 μm to about 0.15 μm.

A p-type GaAs contact layer 17 (p-type impurities: Be, impurity concentration: about $1 \times 10^{19}$ cm$^{-3}$, thickness: about 500 nm) is formed on the ridge portion 15a of the second cladding layer 15 via a p-type GaInP intermediate layer 16 (p-type impurities: Be, impurity concentration: about $1 \times 10^{19}$ cm$^{-3}$, thickness: about 50 nm). The ridge portion 15a of the second cladding layer 15, the p-type intermediate layer 16, and the p-type contact layer 17 constitute "a striped ridge structure", which functions as a narrowed path of current.

The side faces of the striped ridge structure and the surface of the non-ridge portion 15b of the second cladding layer 15 are covered with a saturable absorbing film 18. As shown in a further enlarged view in FIG. 1B, the saturable absorbing film 18 in this example has a multilayered structure including a first $Al_{0.6}Ga_{0.4}As$ layer 18a (n-type impurities: Si, impurity concentration: about $1 \times 10^{18}$ cm$^{-3}$, thickness: about 20 nm), a GaAs layer 18b (n-type impurities: Si, impurity concentration: about $2 \times 10^{18}$ cm$^{-3}$, thickness: about 30 nm) and a second $Al_{0.6}Ga_{0.4}As$ layer 18c (n-type impurities: Si, impurity concentration: about $1 \times 10^{18}$ cm$^{-3}$, thickness: about 20 nm) in this order. The saturable absorbing film 18 is a component which plays an important role in the semiconductor laser device of the present invention, and the structure and the function thereof will be described in detail later.

An n-type GaAs buried layer 19 (n-type impurities: Si, impurity concentration: about $1 \times 10^{18}$ cm$^{-3}$, thickness: about 1000 nm) is formed on the saturable absorbing film 18 so as to bury the striped ridge structure. A p-type electrode (thickness: about 100 nm) 110 is provided over the n-type GaAs buried layer 19, the saturable absorbing film 18 and the p-type contact layer 17, while an n-type electrode (thickness: about 100 nm) 111 is provided over the lower face of the substrate 11. When a voltage is applied between the electrodes 110 and 111, reverse bias is applied to the pn junction formed between the n-type GaAs buried layer 19 and each of the p-type semiconductor layers. As a result, current flows in a constricted manner into "the striped ridge structure" by the GaAs buried layer 19.

Figure 1B:
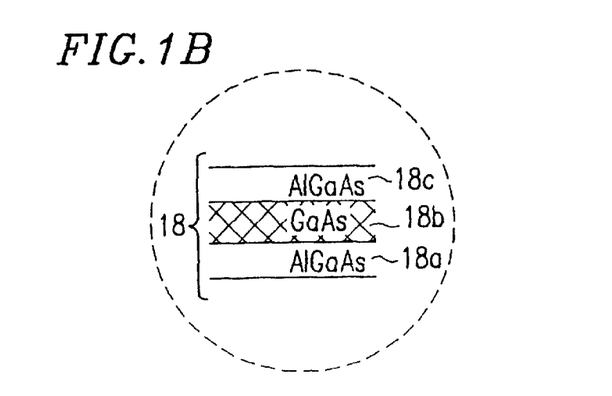
FIG. 1B is an enlarged view of a part of FIG. 1A.

Next, referring to FIGS. 2A through 2C, an exemplary method for producing the semiconductor laser device of FIGS. 1A and 1B will be described.

Figure 2A:
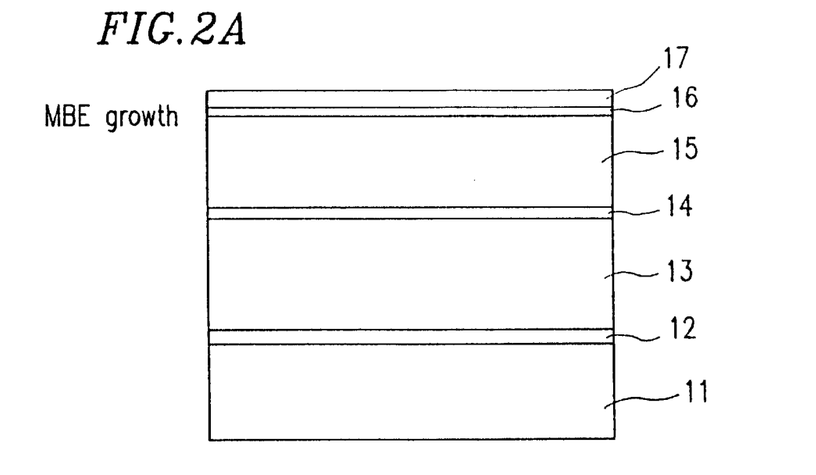
FIGS. 2A through 2C are cross-sectional views showing a method for producing the self-pulsation type semiconductor laser device of FIGS. 1A and 1B.

First, as shown in FIG. 2A, an n-type buffer layer 12, an n-type first cladding layer 13, an active layer 14, a p-type second cladding layer 15, a p-type intermediate layer 16 and a p-type contact layer 17 are grown on a substrate 11, using a known molecular beam epitaxy (MBE) method.

Figure 2B:
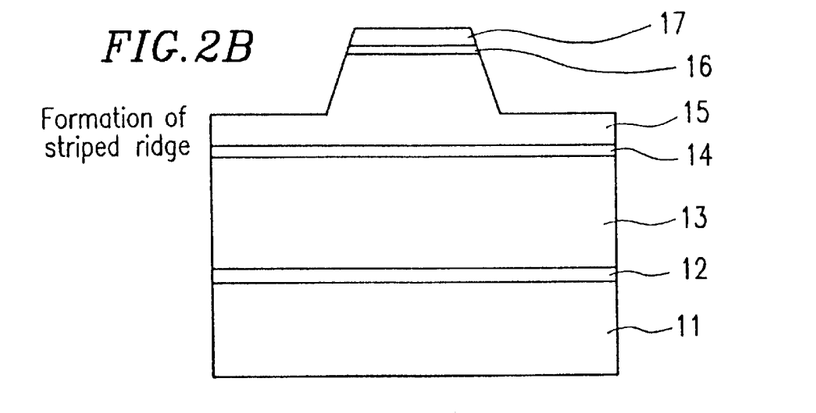

Then, as shown in FIG. 2B, using known photolithography and etching techniques, the portions other than the portion to be formed into a striped ridge structure of the p-type contact layer 17, the p-type intermediate layer 16, and the second cladding layer 15, are selectively removed. The step for forming such a striped ridge structure cannot be performed inside the MBE apparatus, therefore, the substrate 11 is taken out of the MBE apparatus, and then the striped ridge structure is formed. During this process, contaminants such as etchant, vapor in the air or a masking material remain on the surfaces of the semiconductor layers 15, 16 and 17 which are exposed by etching. As the etching technique, wet etching, dry etching, or a combination thereof are available.

Then, the substrate is again loaded into the MBE apparatus, and "regrowth" of the semiconductor layers is performed. More specifically, a first $Al_{0.6}Ga_{0.4}As$ layer 18a, a GaAs layer 18b, a second $Al_{0.6}Ga_{0.4}As$ layer 18c, and a GaAs buried layer 19 are sequentially grown. Prior to the "regrowth", a cleaning step for removing the contaminants is performed in the MBE apparatus. However, complete removal of the contaminants is impossible, and a non-emission recombination center (interface trap) is formed at the interface between the surface of the striped ridge structure and the regrown semiconductor layers (i.e., the first $Al_{0.6}Ga_{0.4}As$ layer 18a).

Then, after taking the substrate out of the MBE apparatus, the n-type semiconductor layers 18a, 18b, 18c and 19 which are grown so as to cover the upper face of the striped ridge structure are selectively etched away. Thus, the structure having a flat upper face is formed, as shown in FIG. 2C. This etching continues until the contact layer 17 is exposed.

Then, for example, using a sputtering method, an Au-Zn film is deposited on the flat face previously formed. Thus, a p-type electrode 110 is formed. Similarly, for example, using a sputtering method, an Au-GeNi film is deposited on the lower face of the substrate 11, thus forming an n-type electrode 111. Thereafter, ordinary steps for producing a semiconductor laser device are performed, and thus a semiconductor laser device shown in FIG. 1A is produced.

Hereinafter, the structure and the function of the saturable absorbing film 18 will be described in detail with reference FIGS. 3A and 3B.

The saturable absorbing film 18 of the present invention includes a first $Al_{0.6}Ga_{0.4}As$ layer (first barrier semiconductor layer) 18a having a first bandgap (Eg1=about 2.0 eV), a GaAs layer (well semiconductor layer) 18b having a second bandgap smaller than the first bandgap (Eg2=about 1.42 eV) and a second $Al_{0.6}Ga_{0.4}As$ layer (second barrier semiconductor layer) 18c having a third bandgap larger than the second bandgap (Eg3=about 2.0 eV). These semiconductor layers 18a, 18b and 18c constitute a double heterostructure. With such a structure, a potential well is formed as shown in FIG. 3A. The GaAs layer (well semiconductor layer) 18b located in a well portion of the potential is formed of a semiconductor layer having a bandgap which generates excited carriers by absorbing laser beams. The well semiconductor layer 18b can be formed of any semiconductor other than GaAs, as long as it has a bandgap which generates excited carriers by absorbing laser beams.

The two $Al_{0.6}Ga_{0.4}As$ layers 18a and 18c which interpose the well semiconductor layer 18b are both formed of a material which can work as a sufficient barrier to excited carriers generated by the well semiconductor layer 18b upon absorbing laser beams. An Al mixture ratio is adjusted so that the bandgaps of the $Al_xGa_{1-x}As$ layer 18a and the $Al_yGa_{1-y}As$ layer 18c are controlled. Thus, a potential barrier having a sufficient height to the bandgap of the well semiconductor layer 18b is formed. The height of the barrier to electrons is preferably about 0.15 eV or more. As long as they function as barrier layers, the compositions of the $Al_xGa_{1-x}As$ layer 18a and the $Al_xGa_{1-y}As$ layer 18c are not necessarily identical.

The first $Al_{0.6}Ga_{0.4}As$ layer 18a functions to prevent the excited carriers generated in the GaAs layer 18b from being recombined via the non-emission recombination center (interface trap) at the regrowth interface. For this reason, it is necessary that the $Al_{0.6}Ga_{0.4}As$ layer 18a has a thickness which prevents the excited carriers from reaching the regrowth interface. However, when the first $Al_{0.6}Ga_{0.4}As$ layer 18a is excessively thick, the distribution intensity of laser beams in the saturable absorbing film becomes small. As a result, self-pulsation is unlikely to occur.

A preferable range of the thickness of the first $Al_{0.6}Ga_{0.4}As$ layer 18a will be described with reference to FIG. 4.

Figure 4:
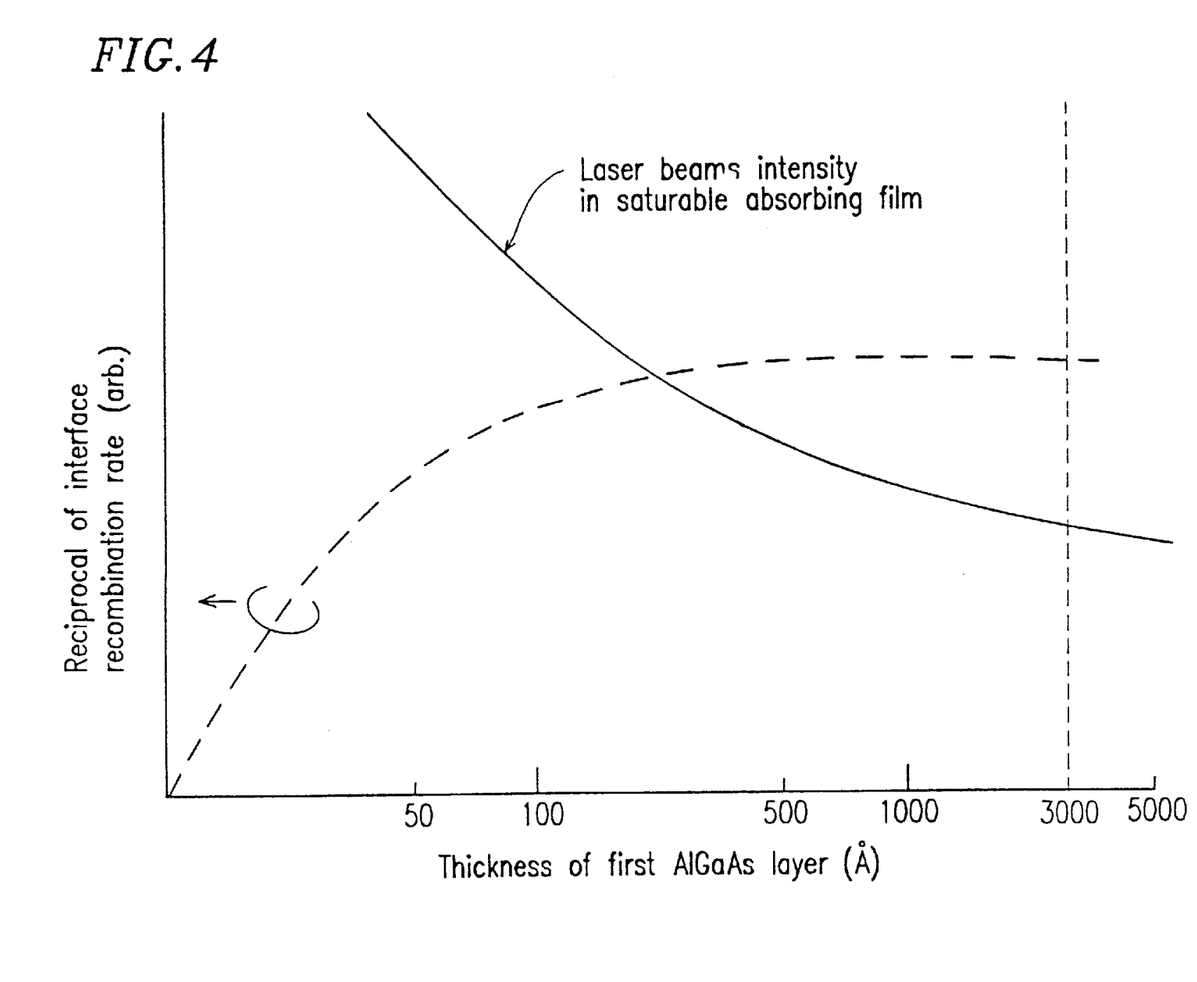
FIG. 4 is a graph showing a preferable thickness of a first AlGaAs barrier layer.

A broken line of FIG. 4 shows the reciprocal of the non-emission recombination rate due to the regrowth interface in the semiconductor laser device of FIG. 1A. This is a parameter showing insusceptibility to the influence from the non-emission recombination at the regrowth interface. This reveals that when the thickness of the first $Al_{0.6}Ga_{0.4}As$ layer 18a becomes smaller than about 100 Å (about 10 nm), the first $Al_{0.6}Ga_{0.4}As$ layer 18a becomes abruptly susceptible to the influence of the regrowth interface. For this reason, it is preferable that the thickness of the first $Al_{0.6}Ga_{0.4}As$ layer 18a is about 100 Å (about 10 nm) or more.

On the other hand, it is believed to be necessary that a laser beam intensity in the well semiconductor layer 18b should be at least about ⅓ of the peak intensity thereof. In the case of the semiconductor laser device of FIG. 1A, as shown with a solid line in FIG. 4, the intensity of laser beams is reduced to about ⅓ of the peak intensity or less at the point where the distance from the regrowth interface is over about 3000 Å. Therefore, the thickness of the first $Al_{0.6}Ga_{0.4}As$ layer 18a is preferably about 3000 Å (about 300 nm) or less.

As a result, the thickness of the first $Al_{0.6}Ga_{0.4}As$ layer 18a is preferably set in the range of about 100 Å to about 3000 Å.

Furthermore, the second $Al_{0.6}Ga_{0.4}As$ layer 18c preferably has a thickness which functions as a barrier preventing the excited carriers from diffusing into the GaAs buried layer 19. When the thickness of the second $Al_{0.6}Ga_{0.4}As$ layer 18c is excessively thin, there is a possibility that the excited carriers will pass through the second $Al_{0.6}Ga_{0.4}As$ layer 18c by a tunneling effect. In view of this point, in the case of this example, the second $Al_{0.6}Ga_{0.4}As$ layer 18c is necessarily about 20 nm or more. On the other hand, with a thickness of about 50 nm, the second $Al_{0.6}Ga_{0.4}As$ layer 18c can sufficiently function as a barrier layer. Even if the second $Al_{0.6}Ga_{0.4}As$ layer 18c is thicker than 50 nm, the effect of carrier accumulation does not correspondingly increase. In view of the fact that a layer including Al, which is easily oxidized, is preferably made as thin as possible in order to prevent the performance of the device from deteriorating, it is preferable that the thickness of the second $Al_{0.6}Ga_{0.4}As$ layer 18c is about 100 nm or less.

The thickness of the GaAs layer 18b is set so as to sufficiently interact with laser beams generated in the active layer 14, thereby causing self-pulsation. Since the intensity of the laser beams lowers with distance from the active layer 14, the extent of the interaction between the laser beams and the GaAs layer 18b depends on the distance between the active layer 14 and the GaAs layer 18b. For this reason, a preferable thickness of the GaAs layer 18b is optimized in view of the distance between the active layer 14 and the GaAs layer 18b.

In the case where the distance between the active layer 14 and the GaAs layer 18b is relatively small (e.g., about 0.10 $\mu$m), the interaction between the laser beams and the GaAs layer 18b is strong. Therefore, self-pulsation can be caused with a relatively thin GaAs layer 18b (e.g., about 15 nm). On the other hand, when the GaAs layer 18b is excessively thick, the GaAs layer 18b partially exists even at the site where the interaction with the laser beams is not effected. The GaAs layer 18b at that site does not substantially contribute to the generation of the excited carriers. For this reason, the surface of the GaAs layer 18b is preferably located closer to the active layer 14 than the site where the distribution intensity of the laser beams is reduced to about 30% of the peak intensity or less.

Thus, a preferable thickness of the GaAs layer 18b depends on the thickness of the first $Al_{0.6}Ga_{0.4}As$ layer 18a and the thickness of the second cladding layer 15.

As described above, the semiconductor laser device of this example includes the saturable absorbing film 18 having the excited carrier accumulation region below the GaAs buried layer 19. Thus, self-pulsation can be stably caused at a high temperature while maintaining the thickness of the active layer relatively thin. In the conventional structure of FIG. 8 previously described, it is necessary to make the thickness of the active layer about 55 nm or more in order to maintain stable self-pulsation, whereas it is sufficient in this example that the thickness of the active layer is about 40 nm. As a result, a radiation angle $\theta\perp$ in a vertical direction can be about 32°.

According to the experiments by the present inventors, in the case where the active layer having a multiple quantum well structure is used in the conventional semiconductor laser device of FIG. 8, self-pulsation does not occur with 7 or less well layers of a thickness of about 6 nm. In this case, 10 or more well layers are necessary in order to obtain stable self-pulsation. On the other hand, in this example, self-pulsation occurrence does not depend on the thickness of the active layer 14.

In the GaAs buried layer 49 of the conventional semiconductor laser device shown in FIG. 8, laser beams are absorbed in the vicinity of the ridge portion of the second cladding layer 45 so that excited carriers are generated. However, as shown in FIG. 3B, the excited carriers generated by the absorption of the laser beams in the GaAs buried layer 49 are partially trapped in the non-emission recombination center at the regrowth interface and disappear by recombination. Furthermore, the remaining excited carriers diffuse into the GaAs buried layer 49 to the direction apart from the regrowth interface. As a result, the excited carriers generated in the GaAs buried layer 49 by the absorption of the laser beams are not accumulated in the GaAs buried layer 49, so that the GaAs buried layer 49 cannot function as a saturable absorbing region.

Figure 3A:
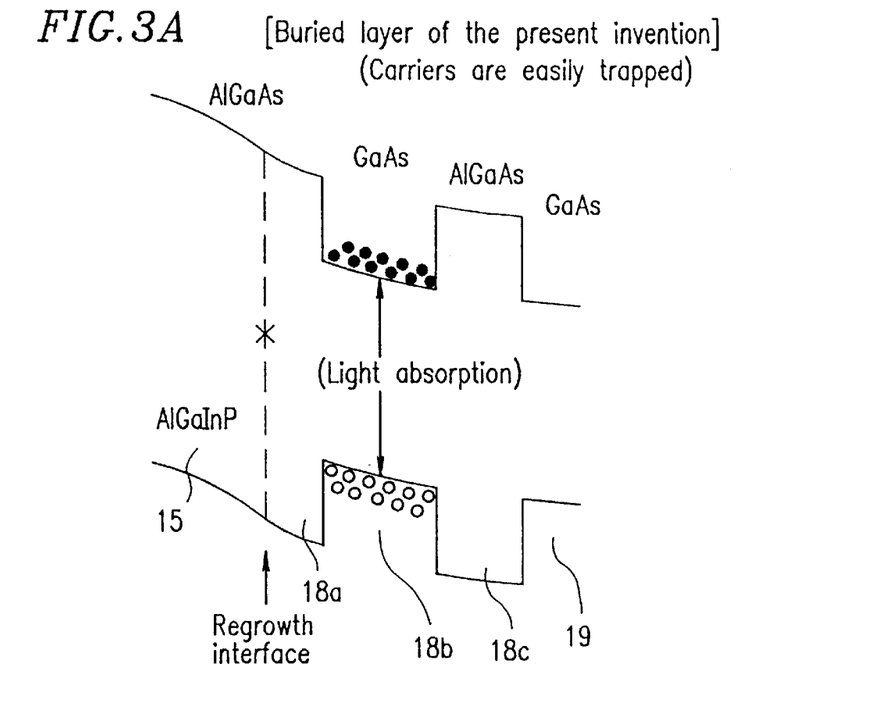
FIG. 3A is a view showing a band diagram in the vicinity of regrowth interface in the self-pulsation type semiconductor laser device of FIGS. 1A and 1B according to the present invention.
Figure 3B:
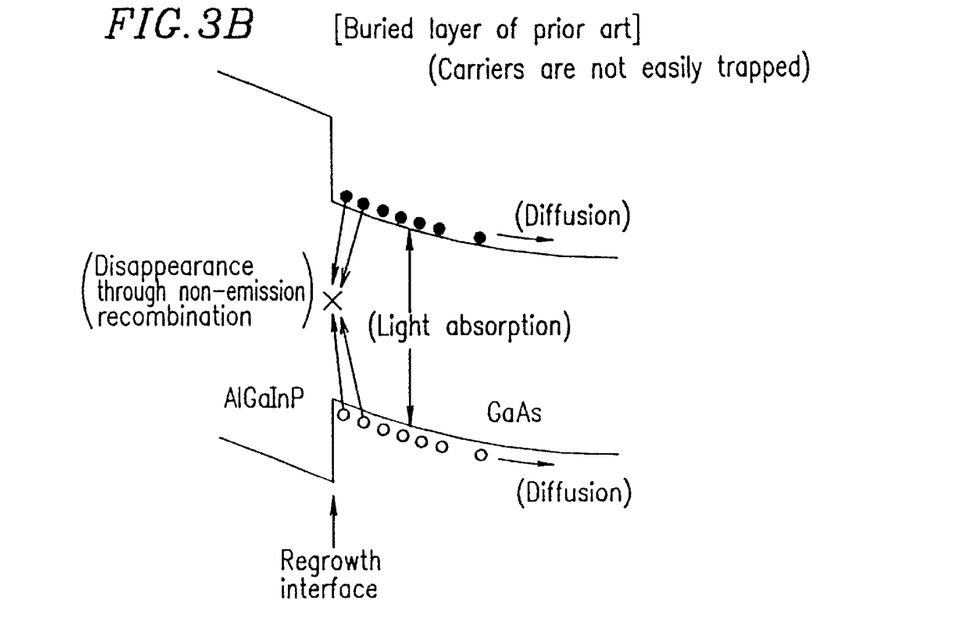
FIG. 3B is a view showing a band diagram in the vicinity of regrowth interface in a conventional semiconductor laser device.
Figure 5A:
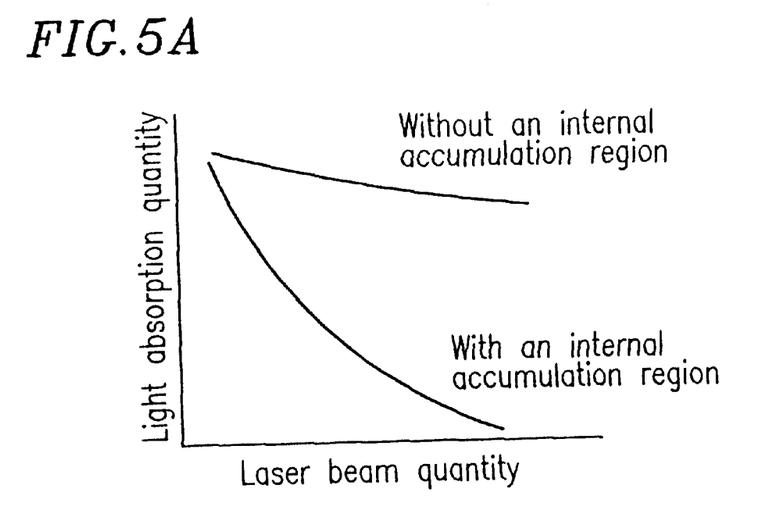
FIG. 5A is a graph showing the relationship between a laser beam amount and a light absorption amount.

FIG. 5A shows the dependence of the light absorption quantity on the laser beam quantity in both the structure of FIG. 3A (indicated by the expression "with an internal accumulation region") and the structure of FIG. 3B (indicated by the expression "without an internal accumulation region"). As understood from FIG. 5A, in the case of the structure "with an internal accumulation region", the light absorption quantity significantly depends on the laser beam quantity, whereas in the case of the structure "without an internal accumulation region", the light absorption quantity only slightly depends on the laser beam quantity.

Figure 5B:
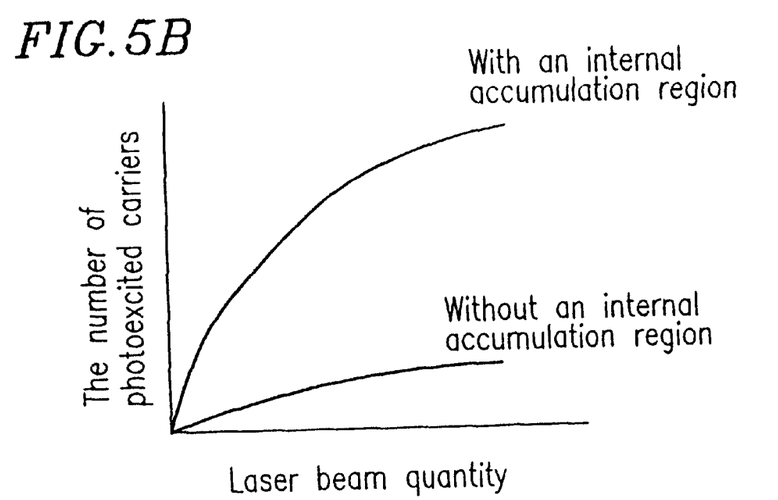
FIG. 5B is a graph showing the relationship between a laser beam amount and the number of excited carriers.

On the other hand, FIG. 5B shows the dependence of the number (density) of excited carriers on the laser beam quantity in both the structure of FIG. 3A (indicated by the expression "with an internal accumulation region") and the structure of FIG. 3B (indicated by the expression "without an internal accumulation region"). As understood from FIG. 5B, in the case of the structure "with an internal accumulation region", the number of the excited carriers significantly increases in accordance with the laser beam quantity, whereas in the case of the structure "without an internal accumulation region", the number of the excited carriers remains small even if the laser beam quantity increases.

As described above, in this example, a region to function as a potential well for the excited carriers is formed by depositing three semiconductor layers 18a, 18b and 18c having different bandgaps, thereby accumulating the excited carriers in a part of the regrown layers. The band structure forming such a potential well is not limited to the structure shown in FIG. 3A previously described. For example, the energy bandgap of the saturable absorbing film 18 may be allowed to change in a curved manner or in multiple phases, thereby forming a region where the excited carriers are accumulated (i.e., a potential well region). It should be noted, however, that at least a part of such a carrier accumulation region is required to have a bandgap allowing laser beams to be absorbed.

Furthermore, in this example, the saturable absorbing film 18 exists not only on the non-ridge portion 15b of the second cladding layer 15, but also on the side faces of the striped ridge structure. Alternatively, the saturable absorbing layer 18 may be located only on the non-ridge portion 15b of the second cladding layer 15.

Furthermore, the present invention is not limited to the case where it is formed of an AlGaInP type semiconductor material. For example, an AlGaAs type material or the like can be used.

EXAMPLE 2

Next, another example where the present invention is applied to an AlGaInP type semiconductor laser device will be described.

Figure 6A:
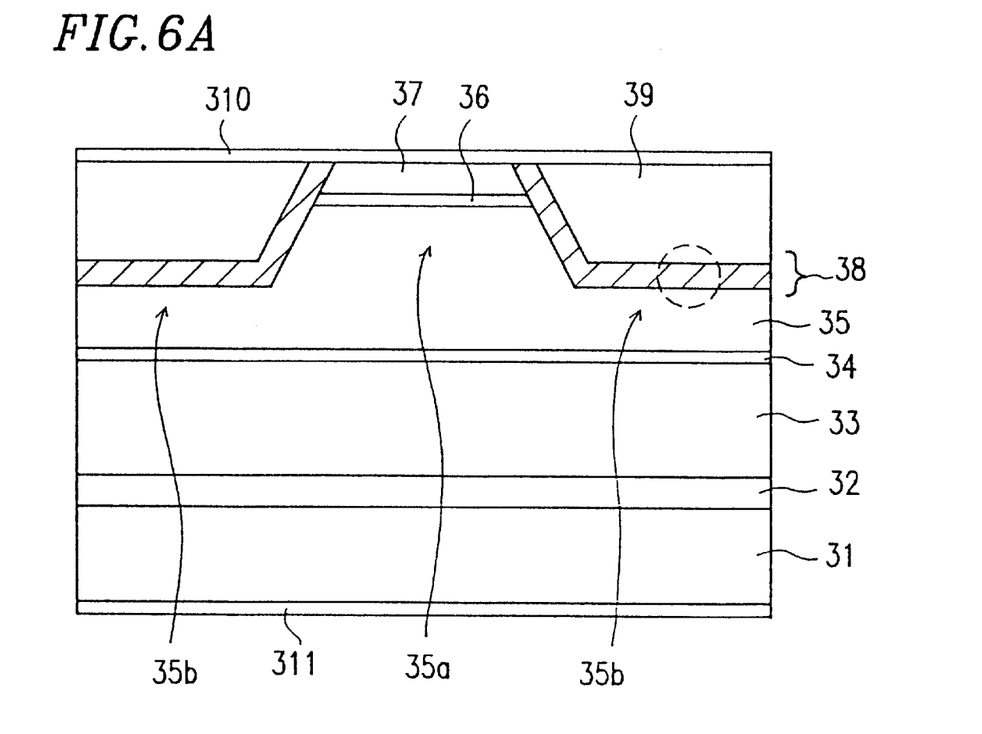
FIG. 6A is a cross-sectional view showing another structure of a self-pulsation type semiconductor laser device according to the present invention.

A semiconductor laser device of FIG. 6A includes an n-type (first conductive type) GaAs substrate 31 and a semiconductor multilayered structure including a plurality of semiconductor layers which are epitaxially grown on the substrate 31.

The semiconductor multilayered structure includes an n-type GaAs buffer layer 32 (n-type impurities: Si, impurity concentration: about $5\times10^{17}$ $cm^{-3}$, thickness: about 500 nm), an n-type $(Al_{0.7}Ga_{0.3})_{0.5}In_{0.5}P$ first cladding layer 33 (n-type impurities: Si, impurity concentration: about $5\times10^{17}$ cm$^{-3}$, thickness: about 1000 nm), a GaInP active layer 34 (thickness: about 350 nm) and a p-type (second conductive type) $(Al_{0.7}Ga_{0.3})_{0.5}In_{0.5}P$ second cladding layer 35 (p-type impurities: Be, impurity concentration: about $1.5\times10^{18}$ cm$^{-3}$, thickness: about 1000 nm) formed on the substrate 31 in this order.

The second cladding layer 35 includes a striped ridge portion 35a having a width of about 3.5 µm to about 4.5 µm, and the portions on both sides of the ridge portion 35a are thinner than the ridge portion 35a. As in Example 1, the width of the ridge portion 35a defines a distribution width of a gain region along a lateral direction and further a beam width of laser beams. Hereinafter, the portion of the second cladding layer 35 which is thinner as described above is referred to as a non-ridge portion 35b.

The thickness of the second cladding layer 35 for the ridge portion 35a is typically about 0.8 µm to about 1.2 µm, and the thickness of the second cladding layer 35 for the non-ridge portion 35b is typically about 0.10 µm to about 0.20 µm.

A p-type GaAs contact layer 37 (p-type impurities: Be, impurity concentration: about $5\times10^{18}$ cm$^{-3}$, thickness: about 500 nm) is formed on the ridge portion 35a of the second cladding layer 35 via a p-type GaInP intermediate layer 36 (p-type impurities: Be, impurity concentration: about $1\times10^{19}$ cm$^{-3}$, thickness: about 50 nm). The ridge portion 35a of the second cladding layer 35, the p-type intermediate layer 36 and the p-type contact layer 37 constitute "a striped ridge structure", which functions as a narrowed path of current.

The side faces of the striped ridge structure and the surface of the non-ridge portion 35b of the second cladding layer 35 are covered with a saturable absorbing film 38. As shown in a further enlarged view of FIG. 6B, the saturable absorbing film 38 has a multiple quantum well structure (MQW) including three well layers where $Al_{0.6}Ga_{0.4}As$ barrier layers and GaAs layers are alternately deposited.

An n-type GaAs buried layer 39 (n-type impurities: Si, impurity concentration: about $5\times10^{17}$ cm$^{-3}$, thickness: about 800 nm) is formed on the saturable absorbing film 38 so as to bury the striped ridge structure. A p-type electrode (thickness: about 100 nm) 310 is provided over the n-type GaAs buried layer 39, the saturable absorbing film 38 and the p-type contact layer 37, while an n-type electrode (thickness: about 100 nm) 311 is provided over the lower face of the substrate 31. When a voltage is applied between the electrodes 310 and 311, reverse bias is applied to the pn junction formed between the n-type GaAs buried layer 39 and the p-type semiconductor layer. As a result, current flows in a constricted manner into "the striped ridge structure" by the GaAs buried layer 39.

Figure 6B:
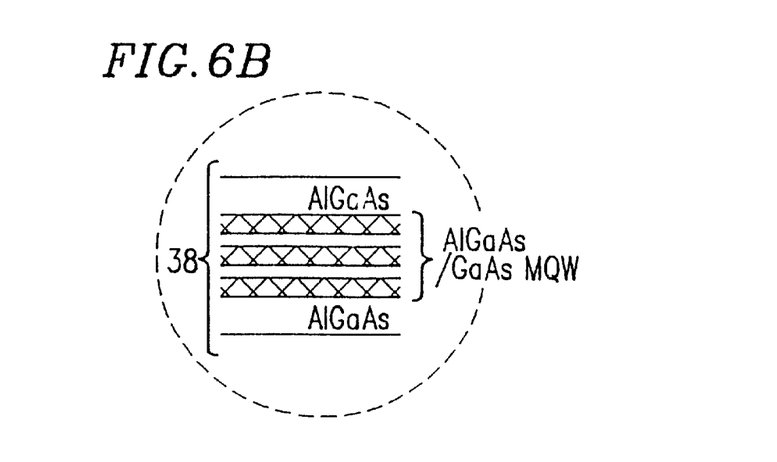
FIG. 6B is an enlarged view of a part of FIG. 6A.

It is preferable that the thickness of a layer in contact with the regrowth interface of the $Al_{0.6}Ga_{0.4}As$ barrier layers included in the saturable absorbing film 38 is more than about 10 nm for the previously mentioned reason. On the other hand, the thicknesses of the other $Al_{0.6}Ga_{0.4}As$ barrier layers are not limited by such a viewpoint. However, when the $Al_{0.6}Ga_{0.4}As$ barrier layer becomes thinner, excited carriers more easily move between the well layers by tunneling the barrier layers. Therefore, in this example, in order to suppress the movement of the excited carriers due to tunneling, the thickness of the $Al_{0.6}Ga_{0.4}As$ barrier layers not in contact with the regrowth interface is set at about 4 nm.

The thickness of the GaAs well layer is set at about 10 nm.

The thickness of the $Al_{0.6}Ga_{0.4}As$ barrier layers not in contact with the regrowth interface is preferably in the range of about 4 nm to about 6 nm. The thickness of the GaAs well layer is preferably in the range of about 8 nm to about 20 nm.

The saturable absorbing film 38 not only should be provided with a multiple quantum well structure, but also should be formed of a material which can generate the excited carriers by absorbing laser beams. As long as such a characteristic is present, the well layer can be formed of materials other than GaAs.

For realizing self-pulsation, it is necessary to shorten the lifetime of the excited carriers of the saturable absorbing film 38 so as to have approximately the same duration as the cycle of the self-pulsation of laser beams, thereby generating a change in the number of excited carriers in approximately the same period of time as the self-pulsation cycle. The self-pulsation cycle is typically about several nanoseconds. For the saturable absorbing film 38, the change rate of excited carriers is relatively as short as about 2 to 3 nanoseconds. This is because the lifetime of carriers is shortened by the influence of carrier recombination at the heterointerface.

In the case of this example, since the number of heterointerfaces is large, the number of excited carriers changes in a shorter period of time than in the previous example. As a result, self-pulsation occurs more easily in this example.

Furthermore, since the saturable absorbing film 38 having a multiple quantum well structure has a relatively large number of heterointerfaces, the saturable absorbing film 38 also has a current blocking function. Since such a saturable absorbing film 38 covers the striped ridge structure, current can be more effectively constricted into the striped ridge structure.

Figure 2C:
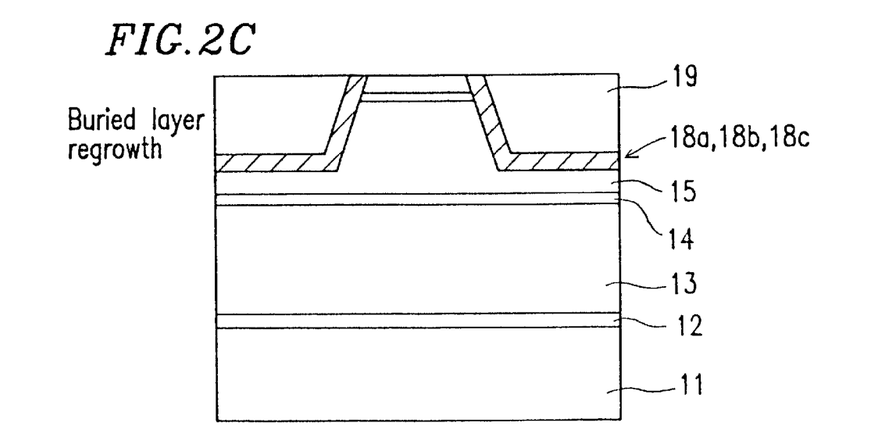

The semiconductor laser device having the above-mentioned structure can be produced in the same manner as previously described in conjunction with Example 1 with reference to FIGS. 2A through 2C, except a step for forming the saturable absorbing film 38. The explanation thereof is omitted herein. The saturable absorbing film 38 can be formed by a known step for forming an ordinary multiple quantum well layer. The explanation thereof is also omitted.

Figure 7:
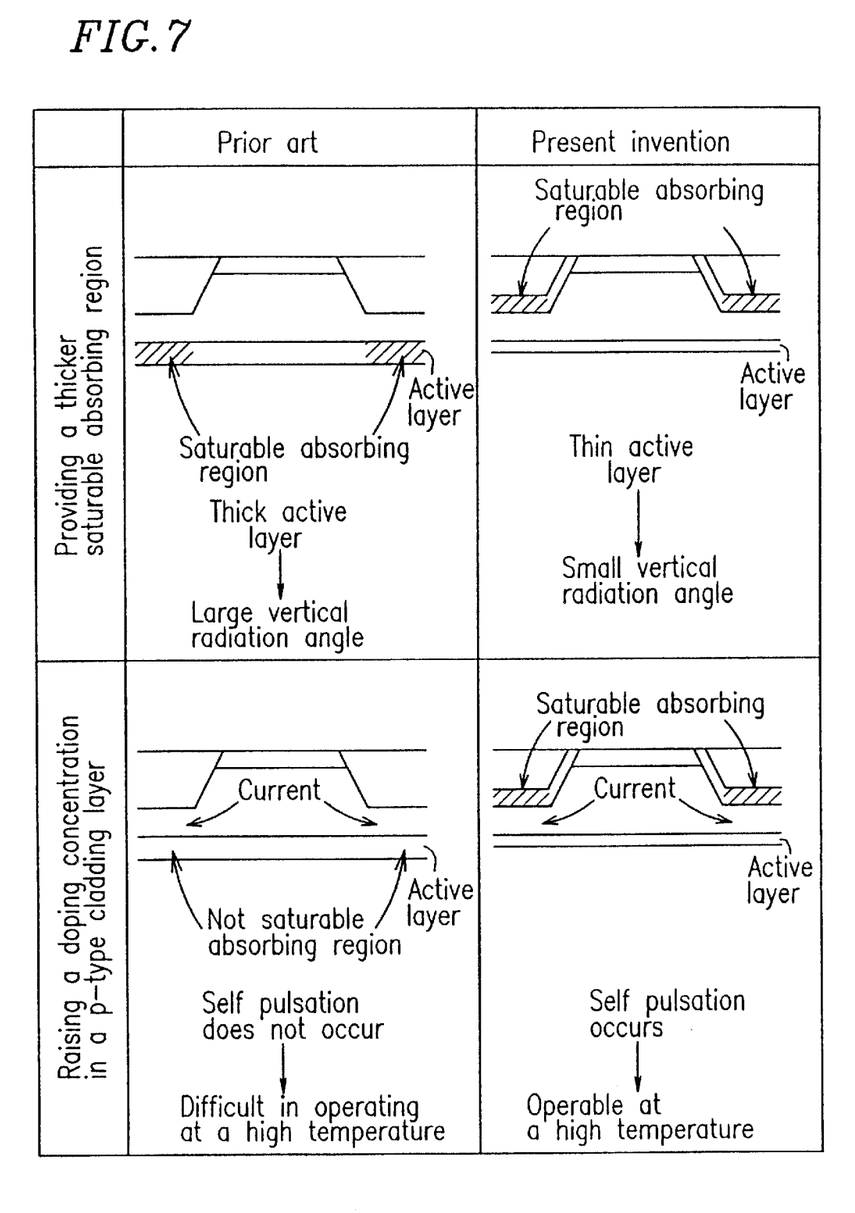
FIG. 7 is a diagram explaining the comparison between the structure of the self-pulsation type semiconductor laser device according to the present invention and the conventional structure.

Then, the advantages of the structure of the present invention over the conventional self-pulsation type semiconductor laser device having the structure shown in FIG. 8 will be described with reference to FIG. 7.

The conventional structure requires a thick active layer for the purpose of obtaining a large saturable absorbing region. As a result, a radiation angle $\theta\perp$ in a vertical direction of emitted laser beams becomes large. On the other hand, according to the present invention, the structure and the size of the saturable absorbing film are determined independently of the structure and the size of the active layer, and it is not necessary to make the active layer thick in order to realize stable self-pulsation.

Furthermore, according to conventional structure, since the doping level of the second cladding layer cannot be raised, the overflow of carriers occurs, thus making it difficult to perform an operation at a high temperature. However, according to the structure of the present invention, since the doping level of the second cladding layer can be raised, the overflow of carriers can be suppressed, thus enabling an operation at a high temperature (e.g., about 60° C. or more).

Although a bulk layer is used as the active layer both in Examples 1 and 2, a multiple quantum well (MQW) layer may be used. Furthermore, the SCH (Separation Confinement Heterostructure), where the active layer is interposed by optical waveguide layers, can be used.

Instead of the GaAs buried layer, an AlGaAs buried layer may be used. Furthermore, instead of such a buried layer, a current blocking layer having a high resistivity may be provided.

The conductive type of each semiconductor layer is not limited to the case described in Examples 1 and 2, and the reverse conductive type may be used.

As described above, according to the present invention, the structure and the size of the saturable absorbing film can be independently determined without depending on the thickness and the structure of the active layer. Furthermore, the doping level of the second cladding layer can be raised. For these reasons, the present invention can provide a self-pulsation type semiconductor laser device having a low level of noise, capable of stable operation at a high temperature while maintaining a small radiation angle $\theta\perp$ in a vertical direction of emitted laser beams.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A self-pulsation type semiconductor laser device comprising:
   a semiconductor substrate of a first conductive type; and
   a multilayered structure including at least an active layer provided on the semiconductor substrate,
   wherein the multilayered structure includes:
   a first cladding layer of the first conductive type provided below the active layer;
   a second cladding layer of a second conductive type having a striped ridge portion provided above the active layer; and
   a saturable absorbing film provided over the second cladding layer, the saturable absorbing film including an accumulation region for accumulating photoexcited carriers, the accumulating region being provided apart from a surface of the second cladding layer.

2. A self-pulsation type semiconductor laser device according to claim 1, wherein the saturable absorbing film includes:
   a first barrier semiconductor layer having a first bandgap;
   a well semiconductor layer having a second bandgap smaller than the first bandgap; and
   a second barrier semiconductor layer having a third bandgap larger than the second bandgap.

3. A self-pulsation type semiconductor laser device according to claim 2, wherein a thickness of the first barrier semiconductor layer is set so that the photoexcited carriers in the accumulation region are prevented from recombining via a non-emission recombination center present at an interface between the saturable absorbing film and the second cladding layer.

4. A self-pulsation type semiconductor laser device according to claim 3, wherein a thickness of the first barrier semiconductor layer is about 10 nm or more.

5. A self-pulsation type semiconductor laser device according to claim 2, wherein:
   the first barrier semiconductor layer is formed of a first AlGaAs layer;
   the well semiconductor layer is formed of a GaAs layer and functions as the accumulation region; and
   the second barrier semiconductor layer is formed of a second AlGaAs layer.

6. A self-pulsation type semiconductor laser device according to claim 1, wherein the saturable absorbing film has a multiple quantum well structure, and a plurality of well layers in the multiple quantum well structure function as the accumulation regions.

7. A self-pulsation type semiconductor laser device according to claim 1 further comprising a semiconductor buried layer for absorbing laser beams provided on the saturable absorbing film.

8. A self-pulsation type semiconductor laser device according to claim 7, wherein the semiconductor buried layer is formed of a GaAs layer.

9. A self-pulsation type semiconductor laser device according to claim 1, wherein the second cladding layer is doped with impurities of a second conductive type at a concentration of about $1\times10^{18}$ cm$^{-3}$ or more.

* * * * *